(12) United States Patent
Gasparik

(10) Patent No.: US 6,774,730 B2
(45) Date of Patent: Aug. 10, 2004

(54) POWER RAILS GLITCH NOISE INSENSITIVE CHARGE PUMP

(75) Inventor: Frank Gasparik, Monument, CO (US)

(73) Assignee: LSI Logic Corporation, Milpitas, CA (US)

( * ) Notice: Subject to any disclaimer, the term of this patent is extended or adjusted under 35 U.S.C. 154(b) by 234 days.

(21) Appl. No.: 10/027,182

(22) Filed: Dec. 20, 2001

(65) Prior Publication Data

US 2002/0075082 A1 Jun. 20, 2002

Related U.S. Application Data

(63) Continuation-in-part of application No. 09/685,616, filed on Oct. 10, 2001, now abandoned.

(51) Int. Cl.[7] ................................................. H03L 7/00
(52) U.S. Cl. ............................... 331/17; 331/8; 327/148
(58) Field of Search ............................... 331/17, 8, 10, 331/18, 25; 327/148, 157, 536

(56) References Cited

U.S. PATENT DOCUMENTS

| | | | | |
|---|---|---|---|---|
| 5,068,626 A | * | 11/1991 | Takagi et al. ................. 331/17 |
| 5,473,283 A | * | 12/1995 | Luich ............................. 331/8 |
| 5,646,563 A | * | 7/1997 | Kuo ............................. 327/157 |
| 5,801,578 A | * | 9/1998 | Bereza ......................... 327/536 |
| 6,160,432 A | * | 12/2000 | Rhee et al. .................. 327/157 |
| 6,163,187 A | * | 12/2000 | Sano ........................... 327/157 |
| 6,255,872 B1 | * | 7/2001 | Harada et al. .............. 327/157 |

* cited by examiner

Primary Examiner—Robert Pascal
Assistant Examiner—Joseph Chang
(74) Attorney, Agent, or Firm—Suiter West PC LLC

(57) ABSTRACT

A the charge pump suitable for use in phase-locked loop (PLL) circuits employed by mixed signal integrated circuits (IC) is disclosed. The PLL charge pump includes a constant current source that generates constant current source references with high power supply rejection for the P- and N-channel devices of the charge pump. Pass-gate transistors are inserted between the output terminals and the drains of the respective P- and N-channel devices. The switching transients power supply and ground are confined to the turn on/off leads of the pass-gate transistors and, thus, are isolated from the constant current source P- and N-channel devices. In exemplary embodiments of the invention, the constant current of the P- and N-channel devices may be made programmable and used for controlling the range of the current controlled oscillator of the PLL circuit.

21 Claims, 4 Drawing Sheets

POWER RAILS GLITCH NOISE INSENSITIVE CHARGE PUMP

CROSS REFERENCE TO RELATED APPLICATIONS

The present application is a continuation-in-part of U.S. patent application Ser. No. 09/685,616 filed Oct. 10, 2001, now abandoned. Said U.S. patent application Ser. No. 09/685,616 is herein incorporated by reference in its entirety.

FIELD OF THE INVENTION

The present invention generally relates to the field of mixed signal integrated circuits (IC) utilizing phase-locked loop (PLL) circuits, and more particularly to a power rails glitch noise insensitive PLL charge pump suitable for use in such PLL circuits that is capable of substantially diminishing the adverse effects of supply/ground glitches upon the capability of the PLL circuits to stay in lock.

BACKGROUND OF THE INVENTION

Mixed signal integrated circuits (IC) are comprised of both digital and analog functional blocks. Digital circuits operate in switching mode and tend to generate substantial transients across the power supplies. These transients take the form of "glitches" that are superimposed upon the power and ground rails. These glitches are caused by the switched currents flowing through the supply and ground interconnects. Every piece of interconnect has a specific resistance ($\Delta R$), capacitance ($\Delta C$) and inductance ($\Delta L$), which constitute a complex impedance ($Z_1$). Switched currents produce transient signals ("glitches") across such impedance ($Z_1$). While a few hundred-millivolt excursion of the power supply and ground may be inconsequential for purely digital circuits, mixed signal integrated circuits (IC) contain many analog components such as amplifiers, filters and oscillators. Such analog circuitry is substantially more susceptible to supply and ground noise. The susceptibility of the analog circuit to such noise is commonly described by the power supply rejection of the integrated circuit (IC) which describes the circuit's ability to operate under such adverse conditions.

Interaction between digital and analog circuits in mixed signal integrated circuits (IC) is mainly through common power supplies and ground connections. Other channels of interactions are through the integrated circuit (IC) substrate ties, overlapping parasitic capacitances, mutual inductances, and the like. Consequently, separation of the analog and digital supplies and/or grounds has only limited benefits because the analog and digital circuitry must eventually interface on the chip.

Supply/ground transients cause frequency jitter in the phase-locked loop (PLL) charge pump of PLL circuits within such a mixed signal integrated circuits (IC) adversely affecting the ability the PLL circuits to stay in lock. Consequently, it would be advantageous to provide a PLL charge pump capable of isolating such supply/ground transients thereby substantially diminishing the adverse effects of supply/ground glitches upon the capability of the PLL to stay in lock.

SUMMARY OF THE INVENTION

Accordingly, the present invention addresses the effect of supply/ground transients on the charge pump of PLL circuits utilized in mixed signal integrated circuits (IC) by providing a PLL charge pump capable of isolating such supply/ground transients thereby substantially diminishing the adverse effects of supply/ground glitches upon the capability of the PLL to stay in lock. In an exemplary embodiment, the PLL charge pump includes a constant current source that generates constant current source references with high power supply rejection for the P- and N-channel devices of the charge pump. Pass-gate transistors are inserted between the output terminals and the drains of the respective P- and N-channel devices. The switching transients power supply and ground are confined to the turn on/off leads of the pass-gate transistors and, thus, are isolated from the constant current source P- and N-channel devices. In exemplary embodiments of the invention, the constant current of the P- and N-channel devices may be made programmable and used for controlling the range of the current controlled oscillator of the PLL circuit.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiment of the invention, an example of which is illustrated in the accompanying drawings.

Figure 1:
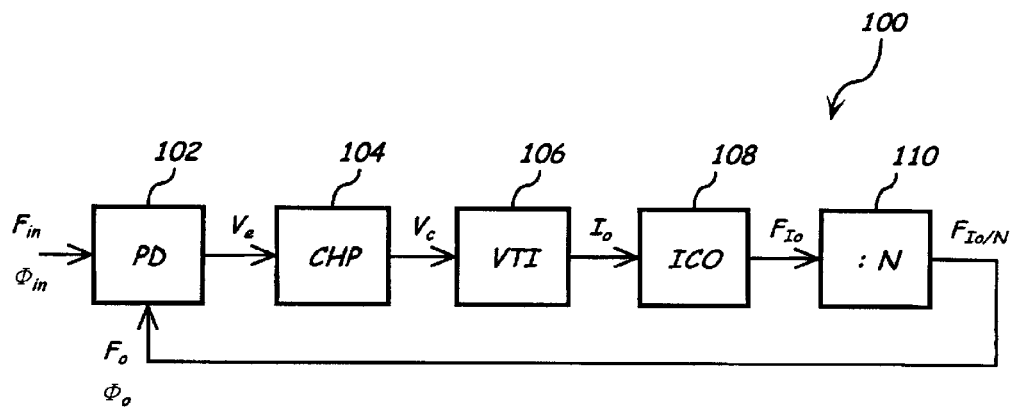
FIG. 1 is a block diagram illustrating a phase-locked loop (PLL) system in accordance with an exemplary embodiment of the present invention.

Referring now to FIG. 1, an exemplary phase-locked loop (PLL) system in accordance with an exemplary embodiment of the present invention is described. The PLL system 100 is comprised of a phase detector (PD) 102, a charge pump (CHP) 104, a voltage to current converter (VTI) 106, current controlled oscillator (ICO) 108, and a divide by N circuit (:N) 110. Phase detector (PD) 102 compares the phase ($\Phi_{in}$) of the input signal, which has a frequency ($F_{in}$), with the phase ($\Phi_o$) of the divided current controlled oscillator (ICO) signal having a frequency ($F_o$). For the PLL system 100 in locked state, the output of the phase detector (PD) 102 drives the charge pump (CHP) 102 with an "error signal" ($V_e$) relative to the phase difference ($\Phi_{in}-\Phi_o$). This error signal ($V_e$) is in the form of a pulse stream applied to the charge pump 104 input. In turn, the charge pump (CHP) 104 processes the error signal ($V_e$) pulse stream into an output voltage ($V_c$) in accordance to phase difference ($\Phi_{in}-\Phi_o$). The voltage output from the charge pump ($V_c$) is converted to a current ($I_o$) by the voltage to current converter (VTI) 106. The current ($I_o$) is subsequently used to control the current controlled oscillator (ICO) 108. In exemplary embodiments, the current controlled oscillator (ICO) frequency ($F_{Io}$) may be a multiple of the input frequency ($F_{in}$), that is $F_{Io}=N \cdot F_{in}$. The divide by N circuit (:N) 110 lowers the current controlled oscillator (ICO) frequency ($F_o$) to substantially equal the input frequency ($F_{in}$). As the phase ($\Phi_{in}$) of the input signal varies, the "error signal" ($V_e$) forces the current controlled oscillator (ICO) 108 to change its frequency, to maintain the PLL system 100 lock, and to make the frequencies $F_o$ and $F_{Io}$ equal. Disturbances of the PLL system's control loop in steady state operation will affect the PLL system's functionality. Such disturbances may result in increased signal jitter or loss of the PLL lock. Spurious signals injected from the power supply or ground into any of the PLL circuit blocks 102–110 will have diverse effects on the control loop's stability. The present invention addresses the effect of supply/ground glitches on the phase-locked loop (PLL) charge pump 104 thereby substantially diminishing the adverse effects of supply/ground glitches upon the capability of the PLL system 100 to stay in lock.

Figure 2:
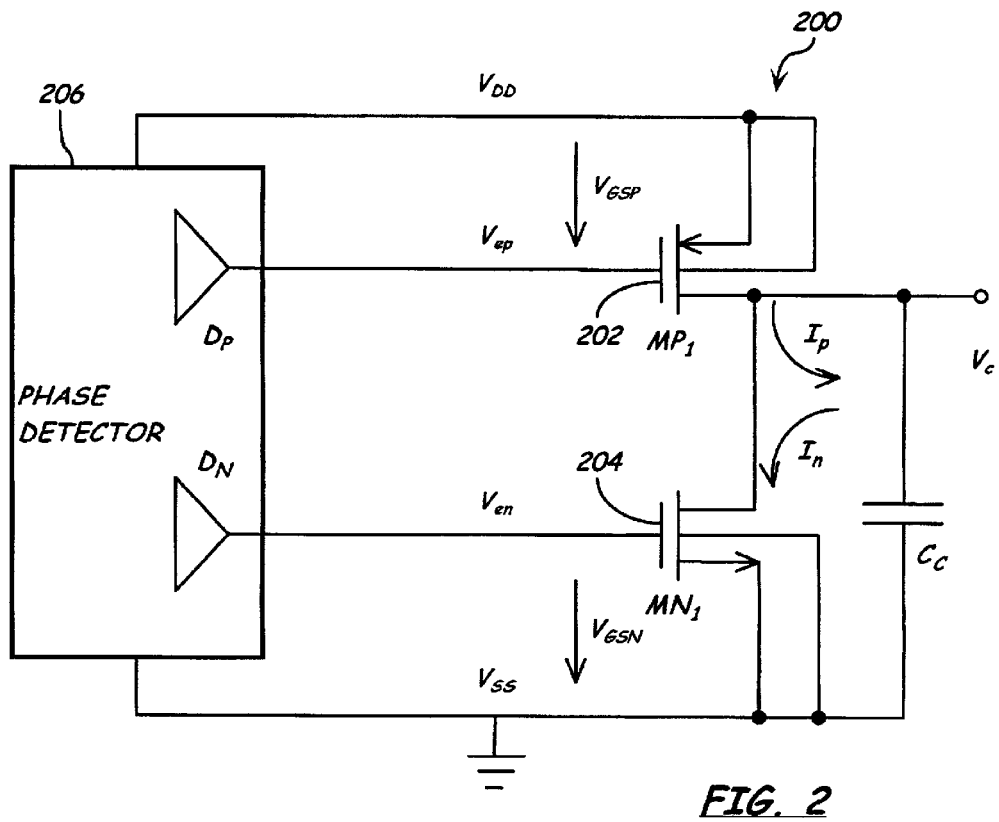
FIG. 2 is a circuit diagram illustrating a typical PLL charge pump of a PLL system such as that shown in FIG. 1.

Referring now to FIG. 2, a charge pump of a PLL System such as that shown in FIG. 1 is described. The PLL charge pump 200 is comprised of a complementary pair complementary metal-oxide semiconductor (CMOS) devices ($MP_1$) 202 and ($MN_1$) 204. Each of these devices 202 & 204 is controlled by the phase detector 206 via signals ($V_{ep}$) and ($V_{en}$) respectively. When the P-channel CMOS device ($MP_1$) 202 is conducting, its drain current ($I_p$) is charging the capacitance ($C_C$) to a more positive potential. Similarly, when the N-channel CMOS device ($MN_1$) 204 is conducting, its drain current ($I_n$) is discharging the capacitance $C_C$ to a more negative potential. The controlling signal voltages ($V_{ep}$) and ($V_{en}$) are in a form of digital pulse streams, continuously updating the output voltage ($V_C$) to maintain the PLL lock. An external signal injected into the PLL signal loop will cause the spurious change in the control voltage ($V_c$) and consequently the disturbance of the equilibrium $F_{in}=F_o$. One example of an external noise injection is a power supply glitch superimposed on the phase detector driver signal (VDD). Such a glitch or transient affects the conducting of the N-channel device ($MN_1$) 204 by causing its drain current ($I_n$) to increase. The N-channel device $MN_1$ 204 is turned on when its gate voltage is equal to the control signal voltage ($V_{en}$), i.e., ($V_{GSN}=V_{en}$). The control signal voltage ($V_{en}$) is driven by the phase detector driver ($D_N$) to the phase detector driver signal voltage ($V_{DD}$). For purposes of illustration, it is assumed that the phase detector driver signal ($V_{DD}$) transient or glitch has a peak magnitude ($+\Delta V_{DD}$). Under equilibrium, the N-channel device ($MN_1$) 204 drain current is equal to $$I_D = \tfrac{1}{2} k_n'(w/l)_n (V_{GSN} - V_{tn})^2.$$

where $V_{tn}$ is the threshold voltage. At the peak of the power supply glitch ($+\Delta V_{DD}$), the new N-channel device ($MN_1$) 204 gate voltage is $$V_{GSN} = V_{DD} + \Delta V_{DD}$$

and the resulting N-channel device ($MN_1$) 204 drain current becomes $$I_D' = \tfrac{1}{2} k_n'(w/l)_n (V_{GSN} + \Delta V_{DD} - V_{tn})^2.$$

For example, for a charge pump having a phase detector driver signal ($V_{DD}$)=3.3V, a threshold control signal voltage ($V_{tn}$)=0.6V, and a supply glitch ($\Delta V_{DD}$)=0.3V, the resulting drain current increase is calculated to be $$I_D'/I_D = (3.3 + 0.3 - 0.6)^2 / (3.3 - 0.6)^2$$
$$= (3.0/2.7)^2$$
$$= 1.23,$$

which represents a twenty-three percent (23%) increase in the drain current $I_D$.

Similar consequences result from ground bounce noise of magnitude ($\Delta V_{SS}$). Such noise will affect the P-channel device ($MP_1$) 202 with an instantaneous increase of its drain current ($I_p$). Further, the power supply glitch ($\Delta V_{DD}$) or ground bounce noise ($\Delta V_{SS}$) may occur asynchronously forcing the current controlled oscillator (ICO) 108 (FIG. 1) to run faster or slower than the input signal frequency ($F_{in}$). Thus, the dynamic response of the PLL charge pump 104 will define whether the PLL system 100 maintains its lock.

Figure 3A:
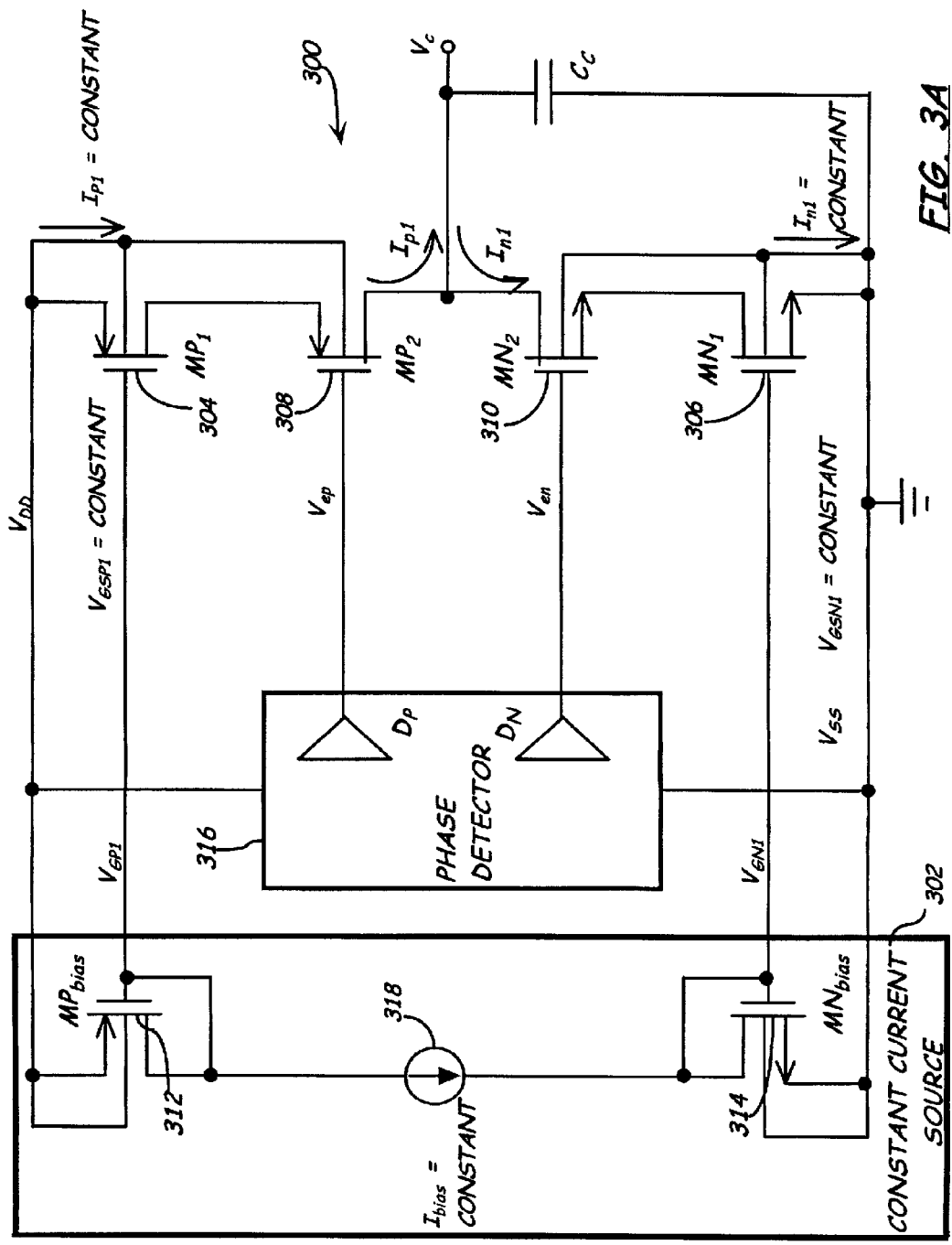
FIGS. 3A and 3B are circuit diagrams illustrating PLL charge pumps in accordance with exemplary embodiments of the present invention.
Figure 3B:
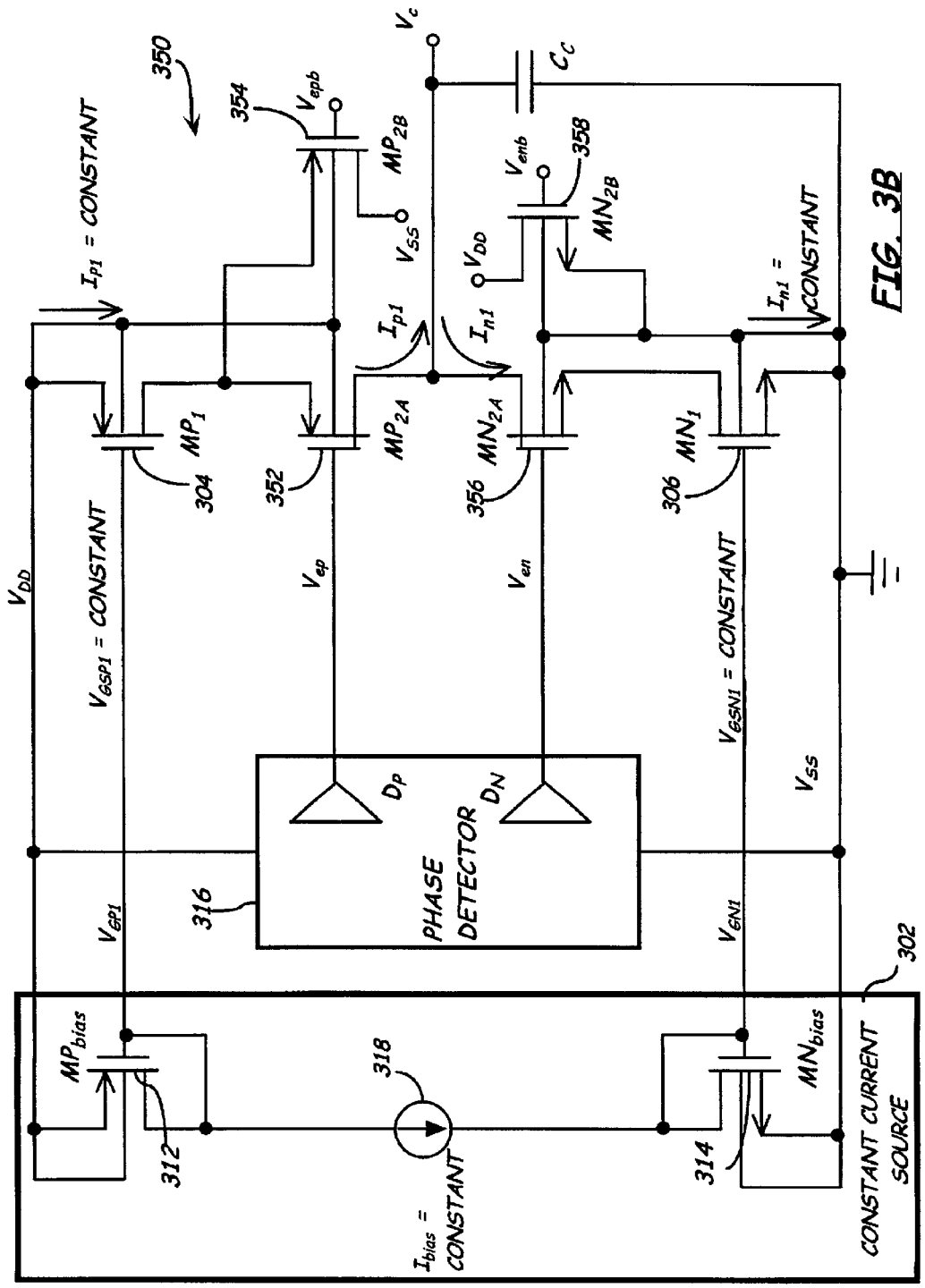

Referring now to FIGS. 3A and 3B, PLL charge pumps capable of isolating power supply and ground rail transients or glitches in accordance with exemplary embodiments of the present invention are described. In exemplary embodiments, the PLL charge pump 300 includes a constant current source 302 which generates constant current source references with high power supply rejection for the P- and N-channel devices ($MP_1$ and $MN_1$) 304 & 306.

As discussed above, the constant current source 302 of PLL charge pump 300 isolates the supply/ground rail transients by generating a constant current source reference with high power supply rejection. This constant current source reference provides a constant gate-to-source bias for P- and N-channel devices ($MP_1$ and $MN_1$) 304 & 306. The P- and N-channel devices ($MP_1$ and $MN_1$) 304 & 306 thus become current mirrors of the constant current source devices ($MP_{bias}$ and $MN_{bias}$) 312 & 314. In this manner, the drain current ($I_{p1}$ and $I_{n1}$) of the P- and N-channel devices ($MP_1$ and $MN_1$) 304 & 306 remains substantially constant and is thus independent of fluctuations in the phase detector drivers ($D_P$ and $D_N$) of phase detector 316. Such fluctuations are commonly experienced by the phase detector drivers ($D_P$ and $D_N$) of phase detectors in prior art PLL systems such as phase detector 206 shown in FIG. 2.

As shown in FIG. 3A, pass-gate transistors ($MP_2$ and $MN_2$) 308 & 310 are inserted between the output terminals and the drains of the respective P- and N-channel devices ($MP_1$ and $MN_1$) 304 & 306. The switching transients power supply and ground are confined to the turn on/off leads of the pass-gate transistors ($MP_2$ and $MN_2$) 308 & 310 and, thus, are isolated from the constant current source P- and N-channel devices ($MP_1$ and $MN_1$) 304 & 306.

Pass-gate transistors ($MP_2$ and $MN_2$) 308 & 310 are preferably inserted between the charge pump output terminal ($V_c$) and the drains of the respective P- and N-channel devices ($MP_1$ and $MN_1$) 304 & 306. Consequently, the phase detector drivers ($D_P$ and $D_N$) of phase detector 316 can be viewed as simple inverters, or, alternately, as more complex logic gates which control the amount of time when the PLL charge pump 300 drives ($I_{p1}$) or sinks ($I_{n1}$) its output current. These output currents ($I_{p1}$ and $I_{n1}$) force the current controlled oscillator (ICO) 108 (FIG. 1) to increase or decrease its frequency in order to maintain the PLL lock. As a result, the charge pump currents ($I_{p1}$ and $I_{n1}$) maintain constant magnitude even in the presence of the supply/ground disturbances.

In the exemplary embodiment shown in FIG. 3A, the switching transients of power supply and ground are confined to the turn on/off leads of the pass-gate transistors ($MP_2$ and $MN_2$) 308 & 310. Consequently, these transients are effectively isolated from the constant current source P- and N-channel devices ($MP_1$ and $MN_1$) 304 & 306. Thus, the effect of the supply/ground transients is substantially limited to that observed in the values of the P- and N-channel devices ($MP_2$ and $MN_2$) 308 & 310 switch on-resistances. The switch on-resistance is inversely proportional to the term ($V_{GSP}-V_{ep}$) of the P-channel switch ($MP_2$) 308 and to ($V_{GSP}-V_{en}$) term of the N-channel switch ($MN_2$) 310, respectively. Assuming that each of these switches is designed for a typical value of on-resistance of 1 kΩ, a supply/ground transient having a peak magnitude ($\Delta V_{DD}$) of 0.3V (300 mV) will increase/decrease the switch on-resistance by approximately 10% (i.e., increase the switch on-resistance to about 1.1 kΩ or decrease the switch on-resistance to about 0.9 kΩ). It should be noted that this pass-gate switch on-resistance is connected in series with the output resistance of the P- and N-channel devices ($MP_1$ and $MN_1$) 304 & 306 which range from about 10 kΩ to approximately 100 kΩ. Thus, the ±100 Ω change in on-resistance is relatively negligible.

FIG. 3B illustrates an exemplary PLL charge pump having pass through devices implemented in differential pairs. In the PLL charge pump 300 illustrated in FIG. 3A, some switching transients may still turn ON and OFF pass-through devices $MP_2$ 308 and $MN_2$ 310. This is because the controlling signals $V_{ep}$ and $V_{en}$ applied to the gates of devices $MP_2$ 308 and $MN_2$ 310 start and/or interrupt the flow of $I_{p1}$ and $I_{n1}$ currents. This abrupt change causes charge injection in a form of a glitch in $I_{p1}$ and $I_{n1}$ currents. The current glitch may force the output voltage $V_c$ to an erroneous final value.

In the PLL charge pump 350 shown in FIG. 3B, the pass through devices are implemented as differential pairs. By implementing the pass trough devices as differential pairs, the switching transient is virtually eliminated. The current from the current sources $MP_1$ and $MN_1$ is never interrupted. The switching device $MP_2$ 308 (FIG. 3A) is replaced by a pair of P-channel devices $MP_{2A}$ 352 and $MP_{2B}$ 354. Similarly, the device $MN_2$ 310 (FIG. 3A) is replaced by a pair of N-channel devices $MN_{2A}$ 356 and $MN_{2B}$ 358. Devices $MP_{2B}$ 354 and $MN_{2B}$ 358 are controlled by the signals $V_{epb}$ and $V_{enb}$, complementary to signals $V_{ep}$ and $V_{en}$. In this manner, the PLL charge pump 350 allows the constant current generated by current reference 318 to be designed virtually noise free from power supply and ground disturbances.

In exemplary embodiments of the invention shown in FIGS. 3A and 3B, the constant current of the P- and N-channel devices ($MP_1$ and $MN_1$) 304 & 306 may be made programmable and used for controlling the range of the current controlled oscillator (ICO) 108 (FIG. 1).

Figure 4:
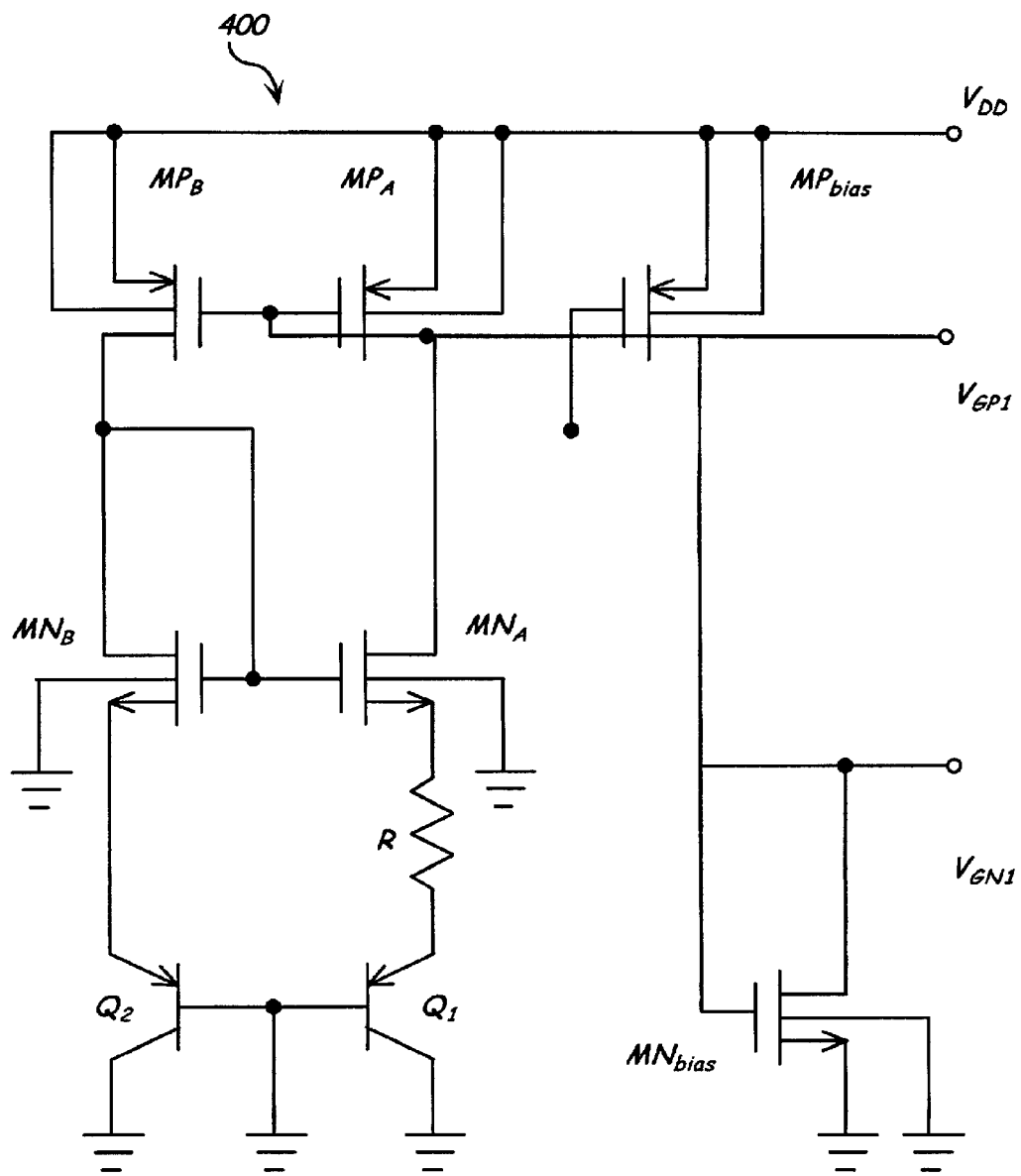
FIG. 4 is a circuit diagram illustrating an exemplary kT/qR constant current source suitable for use with the PLL charge pump of the present invention.

Constant current source 302 preferably employs a supply insensitive kT/qR constant current source or generator ($I_{bias}$) 318. FIG. 4 illustrates one such supply insensitive kT/qR constant current generator 400 suitable for use in the present invention. Such kT/qR constant current sources or generators 400 are well known in the art being widely used in analog circuit design. Consequently, substitution of an alternate supply insensitive kT/qR constant current source or generator ($I_{bias}$) for the supply insensitive kT/qR constant current generator ($I_{bias}$) 400 specifically disclosed herein by one of ordinary skill in the art, would not depart from the scope and spirit of the present invention.

It is believed that the power rails glitch noise insensitive charge pump of the present invention and many of their attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A charge pump for a phase-locked loop circuit suitable for use in a mixed signal integrated circuit, the charge pump having complementary P- and N-channel charge pump devices, comprising:
   a constant current generator suitable for generating a current reference for providing a substantially constant gate-to-source bias for the P- and N-channel charge pump devices;
   a differential pair of P-channel pass-gate devices suitable for isolating the P-channel charge pump device from supply and ground transients in the mixed signal integrated circuit; and
   a differential pair of N-channel pass-gate device suitable for isolating the N-channel charge pump device from supply and ground transients in the mixed signal integrated circuit,
   wherein the charge pump is capable of substantially eliminating loss of lock by the phase-locked loop circuit due to supply and ground transistors.

2. The charge pump as claimed in claim 1, wherein the current reference generated by the constant current generator comprises a high power supply rejection for the P- and N-channel charge pump devices.

3. The charge pump as claimed in claim 1, wherein the constant current generator comprises P- and N-channel bias devices, and wherein the P- and N-channel charge pump devices function as current mirrors of the P- and N-channel bias devices.

4. The charge pump as claimed in claim 3, wherein the P- and N-channel charge pump devices have a substantially constant current.

5. The charge pump as claimed in claim 1, wherein the phase-locked loop circuit includes a phase detector having P- and N-channel drivers, and wherein the P- and N-channel pass gate devices have an on/off state, and wherein the on/off state of the P- and N-channel pass-gate devices is controlled in accordance with the P- and N-channel drivers.

6. The charge pump as claimed in claim 1, wherein the P- and N-channel phase gate
devices comprise an on-resistance, and wherein the supply and ground transients are restricted to the P- and N-channel pass-gate devices' on-resistance.

7. The charge pump as claimed in claim 1, wherein the constant current source is programmable.

8. A phase-locked loop circuit suitable for use in a mixed signal integrated circuit, comprising:
   a phase detector; and
   a charge pump driven by the phase detector, the charge pump having complementary P- and N-channel charge pump devices, the charge pump including:
     a constant current generator suitable for generating a current reference for providing a substantially constant gate-to-source bias for the P- and N-channel charge pump devices;
     a first differential pair of pass-gate devices suitable for isolating the P-channel charge pump device from supply and ground transients in the mixed signal integrated circuit; and a second differential pair of pass-gate devices suitable for isolating the N-channel device from supply and ground transients in the mixed signal integrated circuit.

9. The phase-locked loop circuit as claimed in claim 8, wherein the current reference generated by the constant current generator comprises a high power supply rejection for the P- and N-channel charge pump devices.

10. The phase-locked loop circuit as claimed in claim 8, wherein the constant current generator comprises P- and N-channel bias devices, and wherein the P- and N-channel charge pump devices function as current minors of the P- and N-channel bias devices.

11. The phase-locked loop circuit as claimed in claim 10, wherein the P- and N-channel charge pump devices have a substantially constant current.

12. The phase-locked loop circuit as claimed in claim 8, wherein the phase detector comprises P- and N-channel drivers, and wherein the P- and N-channel pass gate devices have an on/off state, and wherein the on/off state of the P- and N-channel pass-gate devices is controlled in accordance with the P- and N-channel drivers.

13. The phase-locked loop circuit as claimed in claim 8, wherein the P- and N-channel phase gate devices comprise an on-resistance, and wherein the supply and ground transients are restricted to the P- and N-channel pass-gate devices' on-resistance.

14. The phase-locked loop circuit as claimed in claim 8, wherein the charge pump is programmable.

15. A mixed signal integrated circuit having a phase-locked loop circuit, comprising:
  a phase detector; and
  a charge pump driven by the phase detector, the charge pump having complementary P- and N-channel charge pump devices, the charge pump including:
    a constant current generator suitable for generating a current reference for providing a substantially constant gate-to-source bias for the P- and N-channel charge pump devices;
    a first differential pair of pass-gate devices suitable for isolating the P-channel charge pump device from supply and ground transients in the mixed signal integrated circuit; and
    a second differential pair of pass-gate devices suitable for isolating the N-channel device from supply and ground transients in the mixed signal integrated circuit.

16. The mixed signal integrated circuit as claimed in claim 15, wherein the current reference generated by the constant current generator comprises a high power supply rejection for the P- and N-channel charge pump devices.

17. The mixed signal integrated circuit as claimed in claim 15, wherein the constant current generator comprises P- and N-channel bias devices, and wherein the P- and N-channel charge pump devices function as current mirrors of the P- and N-channel bias devices.

18. The mixed signal integrated circuit as claimed in claim 17, wherein the P- and N-channel charge pump devices have a substantially constant current.

19. The mixed signal integrated circuit as claimed in claim 15, wherein the phase detector comprises P- and N-channel drivers, and wherein the P- and N-channel pass gate devices have an on/off state, and wherein the on/off state of the P- and N-channel pass-gate devices is controlled in accordance with the P- and N-channel drivers.

20. The mixed signal integrated circuit as claimed in claim 15, wherein the P- and N-channel phase gate devices comprise an on-resistance, and wherein the supply and ground transients are restricted to the P- and N-channel pass-gate devices' on-resistance.

21. The mixed signal integrated circuit as claimed in claim 15, wherein the charge pump is programmable.

* * * * *